United States Patent
Youk

(10) Patent No.: US 12,228,811 B2
(45) Date of Patent: Feb. 18, 2025

(54) DISPLAY DEVICE

(71) Applicant: LG Display Co., Ltd., Seoul (KR)

(72) Inventor: Shimkeun Youk, Seoul (KR)

(73) Assignee: LG Display Co., Ltd., Seoul (KR)

( * ) Notice: Subject to any disclaimer, the term of this patent is extended or adjusted under 35 U.S.C. 154(b) by 44 days.

(21) Appl. No.: 18/198,106

(22) Filed: May 16, 2023

(65) Prior Publication Data
US 2023/0393427 A1 Dec. 7, 2023

(30) Foreign Application Priority Data

Jun. 3, 2022 (KR) .................. 10-2022-0068363

(51) Int. Cl.
  *G02F 1/1333* (2006.01)
  *H10K 59/80* (2023.01)
(52) U.S. Cl.
  CPC .. *G02F 1/133331* (2021.01); *G02F 1/133311* (2021.01); *G02F 1/133317* (2021.01); *H10K 59/871* (2023.02); *G02F 2202/28* (2013.01)
(58) Field of Classification Search
  None
  See application file for complete search history.

(56) References Cited

U.S. PATENT DOCUMENTS

| | | |
|---|---|---|
| 10,268,086 B2 | 4/2019 | Kim |
| 11,042,065 B2 | 6/2021 | Jin et al. |
| 2018/0164619 A1 | 6/2018 | Kim |
| 2019/0101780 A1 | 4/2019 | Jin et al. |

FOREIGN PATENT DOCUMENTS

| | | | |
|---|---|---|---|
| KR | 10-2016-0075050 A | | 6/2016 |
| KR | 10-2018-0067797 A | | 6/2018 |
| KR | 10-2019-0038726 A | | 4/2019 |
| KR | 20210086029 | * | 7/2021 |

* cited by examiner

*Primary Examiner* — Ashok Patel
(74) *Attorney, Agent, or Firm* — Fenwick & West LLP

(57) ABSTRACT

A display device according to the present disclosure includes a display panel, a cover glass disposed on a top surface of the display panel, a pad which is interposed between the cover glass and the display panel and is divided into a plurality of portions, and a dam pad which encloses the plurality of portions of the pad and is disposed on a rear surface of the edge of the cover glass. Accordingly, according to the present disclosure, the display device is protected from the external impact without increasing the cost, and a reliability and an appearance defect may be improved.

21 Claims, 6 Drawing Sheets

DISPLAY DEVICE

CROSS-REFERENCE TO RELATED APPLICATIONS

This application claims the priority of Republic of Korea Patent Application No. 10-2022-0068363 filed on Jun. 3, 2022, in the Korean Intellectual Property Office, the disclosure of which is hereby incorporated by reference in its entirety.

BACKGROUND

Field

The present disclosure relates to a display device, and more particularly, to a display device in which a cover glass is attached to a display panel without increasing a cost in an extra-large model of the display device.

Description of the Related Art

Generally, a liquid crystal display device is a display device which displays a desired image by individually supplying a data signal to pixels which are disposed in a matrix in response to image information to adjust a light transmittance of the pixels. The liquid crystal display device includes a liquid crystal panel in which pixels are disposed in a matrix and a driver which drives the pixels.

The liquid crystal panel is configured by a color filter substrate and an array substrate which are bonded to be opposite to each other to maintain a uniform cell gap and a liquid crystal layer formed in a cell gap between the color filter substrate and the array substrate. A common electrode and a pixel electrode are formed in the liquid crystal panel in which the color filter substrate and the array substrate are bonded to apply an electric field to the liquid crystal layer.

When a voltage of a data signal which is applied to a pixel electrode is controlled in a state in which a voltage is applied to the common electrode, liquid crystals of the liquid crystal layer rotate by dielectric anisotropy according to an electric field between the common electrode and the pixel electrode to transmit or block light for every pixel. By doing this, letters or images are displayed.

In the liquid crystal display device, a cover glass (or a window glass) for protecting the liquid crystal display device from external impact is provided on an entire surface of the display panel. That is, the liquid crystal panel and the entire surface of the cover glass are attached by surface-to-surface using an optically clear resin (OCR). However, as the size of the liquid crystal display device is increased, an amount of OCR used is increased thereby increasing cost.

SUMMARY

Accordingly, an object to be achieved by the present disclosure is to provide a display device which attaches only an edge of a cover glass using a pad by erasing an OCR of the related art.

However, in an extra-large model, the pad is divided to be attached during the process. In this case, an interval between the divided pads (hereinafter, referred to as a divided portion) is not sealed to cause a reliability issue due to inflow of the air.

Accordingly, another object to be achieved by the present disclosure is to provide a display device in which a divided portion of a pad is sealed to improve the reliability.

Objects of the present disclosure are not limited to the above-mentioned objects, and other objects, which are not mentioned above, can be clearly understood by those skilled in the art from the following descriptions.

In order to achieve the above-described objects, according to an aspect of the present disclosure, a display device may include a display panel, and a cover glass disposed on a top surface of the display panel. In addition, a display device may include a pad which is interposed between the cover glass and the display panel and is divided into a plurality of portions, and a dam pad which encloses a divided portion of the divided pad and is disposed on a rear surface of an edge of the cover glass.

According to another aspect of the present disclosure, a display device may include a display panel; a cover glass disposed on a top surface of the display panel; and a pad which is interposed between the cover glass and the display panel and is divided into a plurality of portions, wherein the pad is disposed on a top surface of an edge of the display panel to fasten the cover glass and the display panel with each other, and wherein a divided portion of the divided pad is sealed by a resin.

Other detailed matters of the exemplary embodiments are included in the detailed description and the drawings.

According to the present disclosure, in a display device of an extra-large model, the cover glass is attached to an edge of the display panel using a divided pad, instead of the existing OCR. Further, according to the present disclosure, a divided portion of the pad is enclosed by a dam pad formed of a soft material and a resin is filled through a slit formed in the dam pad to seal the divided portion of the pad from the outside. Accordingly, the present disclosure provides an effect of protecting the display device from the external impact without increasing the cost and improving a reliability and an appearance defect.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
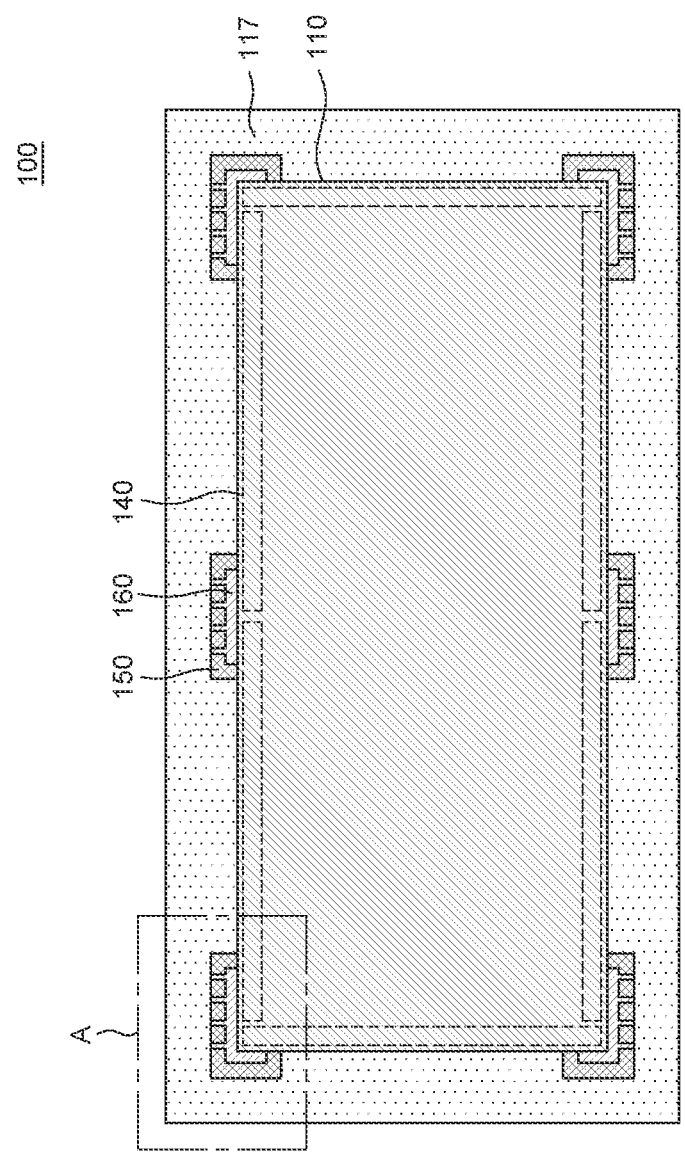
FIG. 1 is a rear view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, the element or layer may be directly disposed on the another layer or another element, or other element or layer may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to the exemplary embodiment of the present disclosure will be described in more detail with reference to the accompanying drawings and exemplary embodiments as follows.

FIG. 1 is a rear view of a display device according to an exemplary embodiment of the present disclosure.

Figure 2:
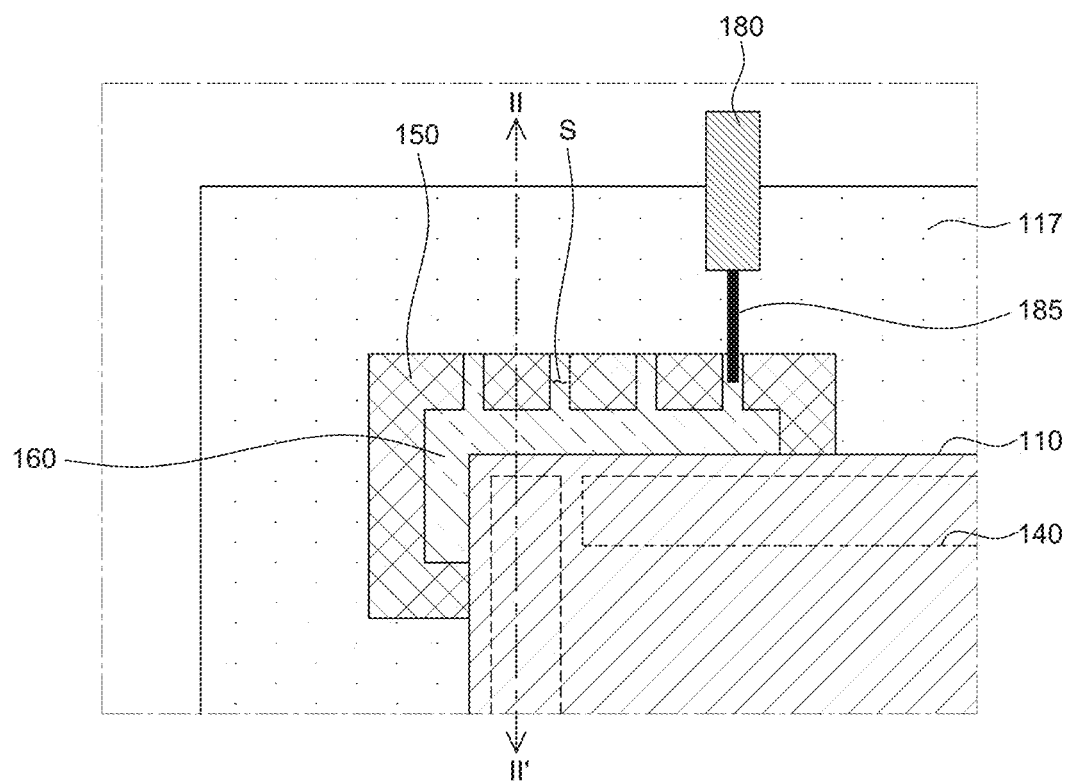
FIG. 2 is a view enlarging a part A of FIG. 1 according to an exemplary embodiment of the present disclosure.

FIG. 2 is a view enlarging a part A of FIG. 1 according to an exemplary embodiment of the present disclosure.

Figure 3:
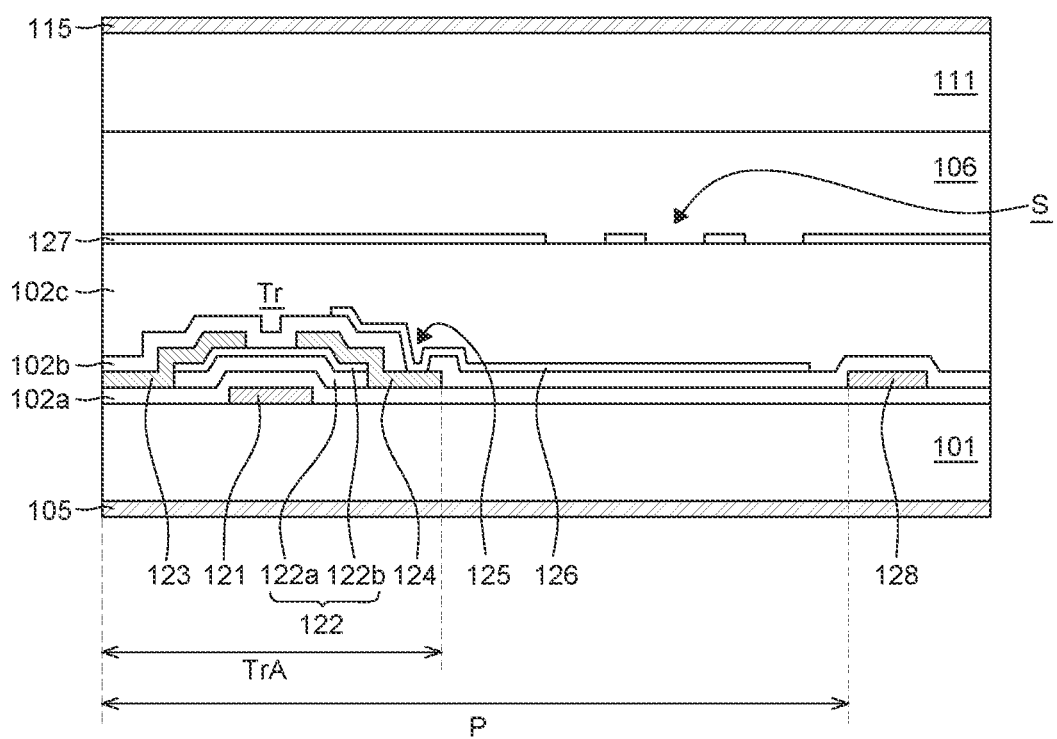
FIG. 3 is a cross-sectional view illustrating a sub pixel of a display panel according to an exemplary embodiment of the present disclosure.

FIG. 3 is a cross-sectional view illustrating a sub pixel of a display panel according to an exemplary embodiment of the present disclosure.

In FIGS. 1 and 2, for the convenience of description, a backlight unit, a guide panel, and a lower cover which are disposed on a rear surface of a display panel 110 are not illustrated. The backlight unit, the guide panel, and the lower cover are described in detail below with reference to FIG. 5.

Referring to FIGS. 1 and 2, a display device 100 according to an exemplary embodiment of the present disclosure may include a display panel 110, a timing controller (not illustrated), and a data driver and a gate driver (not illustrated). The display panel 110 displays an image. The timing controller generates a gate control signal and a data control signal in response to a control signal and a data signal supplied from an external system (not illustrated) and relocates the data signal. The data and gate drivers are configured by a plurality of driver integrated circuits (IC) to drive the display panel 110.

For example, when the display panel 110 is a liquid crystal display panel, the display panel 110 includes a first substrate and a second substrate which are bonded to be opposite to each other with a liquid crystal layer therebetween and first and second polarization plates. The first and second polarization plates are attached on outer surfaces of the first substrate and the second substrate, respectively.

A cover glass 117 which is formed of a glass may be disposed on a top surface of the display panel 110.

The display panel 110 may include thin film transistors. One end of the thin film transistor is connected to a liquid crystal capacitor at points at which the plurality of gate lines and data lines intersect in a matrix. The display panel 110 will be described in detail below with reference to FIG. 3.

In the meantime, even though it is not illustrated, the timing controller receives a plurality of control signals and data signals from an external system to generate a gate control signal and supply the gate control signal to the gate driver in response thereto. Further, the timing controller generates the data control signal in response to the control signal and relocates the data control signal to be processed by the data driver to supply the data control signal to the data driver through a printed circuit board (PCB).

The gate driver sequentially supplies a gate driving signal to the display panel 110 in the unit of one horizontal line through the gate line, in response to the gate control signal to be driven to select the pixel area in the display panel 110 in the unit of one horizontal line. Whenever the gate line is sequentially selected, the data driver may supply an image signal including image information to the display panel 110 through the data line, in response to the data control signal and the relocated data signal.

The data driver may be configured in a chip on film (COF) manner One data driver IC may be bonded onto one flexible circuit film. However, the present disclosure is not limited thereto, so that the data driver may be configured in a chip on glass (COG) manner.

In addition, a thin film transistor provided in the display panel 110 is turned on in response to a scanning signal and supplies an image signal to a pixel electrode connected thereto. A light transmittance of a liquid crystal layer is adjusted by an electric field formed between the pixel electrode and the common electrode by this operation to display an image.

In the meantime, referring to FIG. 3, when the display panel 110 is a liquid crystal display panel, the display panel 110 may include first and second substrates 101 and 111 opposite to each other and a liquid crystal layer 106 disposed between the first and second substrates 101 and 111.

The first and second substrates 101 and 111 may be formed of a glass material, or for example, may be formed of a flexible material, such as a plastic material including polyimide. In this case, the display panel 110 may serve as a flexible display panel.

An alignment film which determines an initial molecular alignment direction may be disposed at the boundary between the first substrate 101 and the liquid crystal layer 106 and the boundary between the second substrate 111 and the liquid crystal layer 106. Further, a seal pattern may be formed between the first substrate 101 and the second substrate 111 to suppress the leakage of the liquid crystal layer 106.

A plurality of electrodes and wiring lines which are laminated above the first substrate 101 will be described in more detail. A plurality of gate lines extends in a first direction to be disposed above the first substrate 101 and a plurality of data lines 128 is disposed in a second direction intersecting the plurality of gate lines to define a plurality of pixel areas P.

One end of the gate line extends in a non-active area to form a gate pad and one end of the data line 128 extends in a non-active area to form a data pad.

In each of the plurality of pixel areas P, a thin film transistor Tr configured by a gate electrode 121, a gate insulating layer 102a, a semiconductor layer 122 including an active layer 122a and an ohmic contact layer 122b, and source and drain electrodes 123 and 124 may be formed.

The gate electrode 121 is connected to a gate line and may be formed on the first substrate 101. The gate insulating layer 102a formed of an inorganic insulating material, such as silicon oxide (SiOx) or silicon nitride (SiNx), may be formed on the gate electrode 121 and the gate line.

An active layer 122a which is formed of a pure amorphous silicon and the ohmic contact layer 122b which is formed on the active layer 122a and exposes a center of the active layer 122a and is formed of an impurity amorphous silicon may be formed on the gate insulating layer 102a. The active layer 122a and the ohmic contact layer 122b configure the semiconductor layer 122. However, the present disclosure is not limited thereto, so that the semiconductor layer 122 may be formed of a semiconductor material, such as an oxide semiconductor or a poly silicon. In this case, the ohmic contact layer 122b may be omitted.

The source electrode 123 and the drain electrode 124 which expose the center of the semiconductor layer 122 may be formed on the semiconductor layer 122 to be spaced apart from each other.

The source electrode 123 is located on the semiconductor layer 122 and extends from the data line 128 and the drain electrode 124 may be disposed on the semiconductor layer 122 to be spaced apart from the source electrode 123. The thin film transistor Tr may be located in the switching area TrA.

Further, the data line 128 may be disposed on the gate insulating layer 102a along the second direction to intersect the gate line. The data line 128 may extend from the source electrode 123 of the thin film transistor Tr located in the pixel area P.

A first passivation layer 102b may be disposed on the data line 128, the source electrode 123, the drain electrode 124, and the common line. A drain contact hole 125 may be formed in the first passivation layer 102b to expose the drain electrode 124 of the thin film transistor Tr.

The first passivation layer 102b may be configured by an inorganic material, such as silicon oxide (SiOx) or silicon nitride (SiNx) or an organic material, such as photo acryl. The first passivation layer 102b may suppress the damage of the ohmic contact layer 122b caused during the process of forming the pixel electrode 126.

Further, in each pixel area P, the pixel electrode 126 which is in contact with the drain electrode 124 of the thin film transistor Tr through the drain contact hole 125 to be electrically connected may be disposed on the first passivation layer 102b.

For example, the pixel electrode 126 is formed of a transparent conductive material, such as indium tin oxide (ITO) or indium zinc oxide (IZO), and has a plate shape in each pixel area P, but is not limited thereto.

A second passivation layer 102c may be disposed on the pixel electrode 126.

The second passivation layer 102c may be configured by an inorganic material, such as silicon oxide (SiOx) or silicon nitride (SiNx) or an organic material such as photo acryl.

The common electrode 127 which overlaps the plate-shaped pixel electrode 126 and has a plurality of slits (openings) S may be disposed on the second passivation layer 102c. For example, the common electrode 127 may be formed of a transparent conductive material, such as indium tin oxide (ITO) or indium zinc oxide (IZO). The common electrode 127 may be formed on an entire surface of the active area in which a plurality of pixel areas P is formed.

When a voltage is applied between the pixel electrode 126 and the common electrode 127 having a slit S, a fringe field is formed to drive liquid crystals, thereby improving a transmissive efficiency and displaying a high quality image. However, it is not limited thereto. Even though it is not illustrated, a black matrix having an opening corresponding to each pixel area P may be disposed below the second substrate 111 which configures a color filter substrate. In addition, the color filter layer may be disposed below the black matrix and below the second substrate 111 which is exposed through an opening of the black matrix. The color filter layer may include red, green, and blue color filters corresponding to the pixel area P.

Further, an overcoat layer formed of a material, such as polyimide, polyacrylate, or polyurethane, may be further disposed between the color filter layer and the liquid crystal layer 106 to protect the color filter layer and planarize a surface thereof.

The first and second polarization plates 105 and 115 may be respectively attached onto outer surfaces of the first and second substrates 101 and 111 configured as described above.

In the meantime, as described above, the present disclosure is not limited to the liquid crystal display device, but is applicable to an organic light emitting display device and a sub pixel structure of the organic light emitting display device will be described in detail with reference to FIG. 4.

Figure 4:
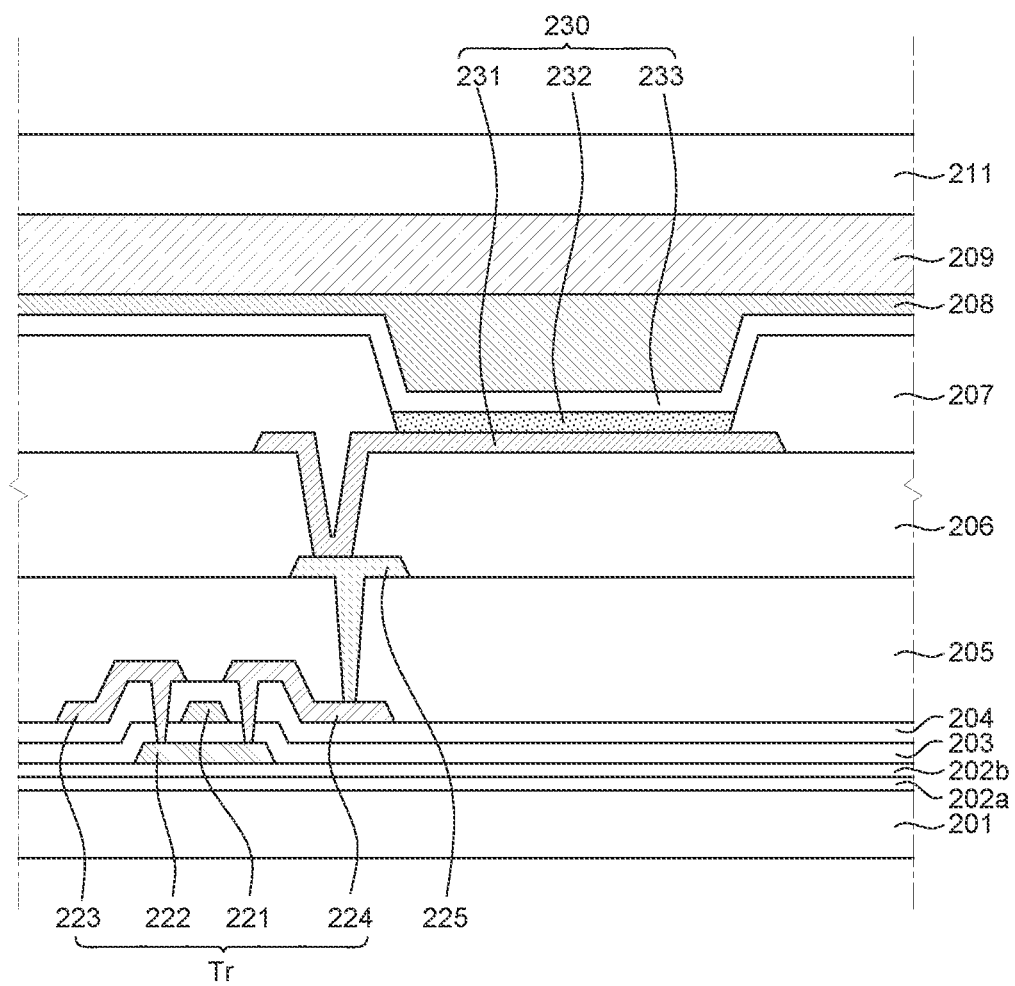
FIG. 4 is a cross-sectional view illustrating a sub pixel of a display panel according to another exemplary embodiment of the present disclosure.

FIG. 4 is a cross-sectional view illustrating a sub pixel of a display panel according to another exemplary embodiment of the present disclosure.

Referring to FIG. 4, in a display panel according to another exemplary embodiment of the present disclosure, a driving device, that is, a thin film transistor Tr may be disposed on a substrate 201.

In addition, planarization layers 205 and 206 may be disposed on the thin film transistor Tr.

Further, an organic light emitting diode 230 which is electrically connected to the thin film transistor Tr may be disposed on the planarization layers 205 and 206. Further, the passivation layer 208 is disposed on the organic light emitting diode 230 to suppress the oxygen and moisture from permeating into the organic light emitting diode 230.

An adhesive film 209 and an encapsulation substrate 211 may be sequentially disposed on the passivation layer 208. However, the display panel according to another exemplary embodiment of the present disclosure is not limited to this laminated structure.

The substrate 201 may be a glass or plastic substrate. When the substrate is a plastic substrate, polyimide based or polycarbonate based materials are used so that the substrate may have a flexibility. Specifically, polyimide may be applied to a high temperature process and is a coatable material so that polyimide may be frequently used for the plastic substrate.

Buffer layers 202a and 202b may be disposed on the substrate 201.

The buffer layers 202a and 202b are functional layers which protect various electrodes and wiring lines from impurities such as alkali ions leaked from the substrate 201 or layers therebelow and may have a multilayered structure which is formed by a first buffer layer 202a and a second buffer layer 202b, but is not limited thereto. However, the present disclosure is not limited thereto. The buffer layers 202a and 202b may be formed of silicon oxide (SiOx), silicon nitride (SiNx), or a plurality of layers thereof.

The buffer layers 202a and 202b may delay the diffusion of moisture and/or oxygen which permeates the substrate 201. The buffer layers 202a and 202b may include a multi buffer and/or an active buffer.

In addition, the thin film transistor Tr may be formed by sequentially disposing the active layer 222, the gate insulating layer 203, the gate electrode 221, the interlayer insulating layer 204, a source electrode and a drain electrode 223 and 224. The thin film transistor Tr is electrically connected to the organic light emitting diode 230 via the connection electrode 225 to transmit a current or a signal to the organic light emitting diode 230.

The active layer 222 may be located on the buffer layers 202a and 202b.

The active layer 222 may be configured by poly silicon (p-Si). In this case, a predetermined region may be doped with impurities. The active layer 222 may be configured by amorphous silicon (a-Si) or an organic semiconductor material, such as pentacene. Moreover, the active layer 222 may be configured by an oxide semiconductor.

The gate insulating layer 203 may be located on the active layer 222. The gate insulating layer 203 may be formed of an insulating inorganic material such as silicon oxide (SiOx) or silicon nitride (SiNx) or an insulating organic material.

The gate electrode 221 may be located on the gate insulating layer 203. The gate electrode 221 may be formed of various conductive materials, for example, magnesium (Mg), aluminum (Al), nickel (Ni), chrome (Cr), molybdenum (Mo), tungsten (W), gold (Au), or an alloy thereof.

The interlayer insulating layer 204 may be disposed on the gate electrode 221.

The interlayer insulating layer 204 may be formed of an insulating material such as silicon oxide (SiOx) or silicon nitride (SiNx) or other insulating organic material.

The gate insulating layer 203 and the interlayer insulating layer 204 are selectively removed to form a contact hole through which the source and drain regions are exposed. The source electrode and the drain electrode 223 and 224 may be formed of a material for an electrode, on the interlayer insulating layer 204 as a single layer or a multi-layered structure. At this time, if necessary, an additional passivation layer which is configured with an inorganic insulating material may be formed to cover the source electrode and drain electrode 223 and 224.

Planarization layers 205 and 206 may be disposed on the thin film transistor Tr configured as described above.

The planarization layers 205 and 206 may have a multi-layered structure configured by at least two layers. For example, referring to FIG. 4, the planarization layers 205 and 206 may include a first planarization layer 205 and a second planarization layer 206. The first planarization layer 205 may be disposed to cover the thin film transistor Tr and expose a part of the drain electrode 224 of the thin film transistor Tr.

The planarization layers 205 and 206 may be overcoat layers, but the present disclosure is not limited thereto.

The connection electrode 225 may be disposed on the first planarization layer 205 to electrically connect the thin film transistor Tr and the organic light emitting diode 230. Further, even though not illustrated in FIG. 4, various metal layers which serve as electric wires/electrodes such as a data line or a signal line may be disposed on the first planarization layer 205.

Further, the second planarization layer 206 may be disposed on the first planarization layer 205 and the connection electrode 225. The planarization layers 205 and 206 of another exemplary embodiment of the present disclosure are configured by two layers because as the resolution of the display device is increased, various signal lines are increased. Therefore, it is difficult to dispose all the wiring lines on one layer while ensuring a minimum interval so that an additional layer is provided. Such an additional layer (that is, the second planarization layer 206) is added so that there is a margin for disposing wiring lines, which makes it easier to design and dispose the wiring lines/electrodes. Further, when a dielectric material is used for the planarization layers 205 and 206 configured by a plurality of layers, the planarization layers 205 and 206 may be utilized to form a capacitance between metal layers.

The second planarization layer 206 may be formed to expose a part of the connection electrode 225 and the drain electrode 224 of the thin film transistor Tr and the anode 231 of the organic light emitting diode 230 may be electrically connected by the connection electrode 225.

The organic light emitting diode 230 may be configured by sequentially disposing the anode 231, the plurality of organic layers 232, and the cathode 233. The organic light emitting diode 230 may be configured by the anode 231 formed on the second planarization layer 206, the organic layer 232 formed on the anode 231, and the cathode 233 formed on the organic layer 232.

At this time, the display device 100 may be implemented as a top emission type or a bottom emission type. In the case of the top emission type, a reflective layer may be formed below the anode 231 to allow light emitted from the organic layer 232 to be reflected by the anode 231 to be directed upwardly, that is, directed to the cathode 233 there above. The reflective layer may be formed of an opaque conductive material having a high reflectance, such as silver (Ag), aluminum (Al), gold (Au), molybdenum (Mo), tungsten (W), chrome (Cr), or an alloy thereof. In contrast, in the case of the bottom emission type, the anode 231 may be only formed of a transparent conductive material, such as indium tin oxide (ITO), indium zin oxide (IZO), or indium gallium zinc oxide (IGZO). Hereinafter, it is assumed that the display device of the present disclosure is a top emission type. However, the present disclosure is not limited thereto.

A bank 207 may be formed in a remaining area excluding the emission area on the second planarization layer 206. Therefore, the bank 207 has a bank hole which exposes the anode 231 corresponding to the emission area. The bank 207 may be formed of an inorganic insulating material, such as silicon nitride (SiNx) or silicon oxide (SiOx), or an organic insulating material, such as BCB, an acrylic-based resin or an imide-based resin.

The organic layer 232 may be disposed on the anode 231 exposed by the bank 207. The organic layer 232 may include an emission layer, an electron injection layer, an electron transport layer, a hole transport layer, a hole injection layer, and the like.

The cathode 233 may be disposed on the organic layer 232.

In the case of the top emission type, the cathode 233 may include a transparent conductive material. For example, the cathode 233 may be formed of indium tin oxide (ITO), indium zin oxide (IZO), indium gallium zinc oxide (IGZO), or the like. In the case of the bottom emission type, the cathode 233 may include any one of the group consisting of metal materials such as gold (Au), silver (Ag), aluminum (Al), molybdenum (Mo), magnesium (Mg), palladium (Pd), copper (CU), and an alloy thereof. Alternatively, the cathode 233 may be configured by laminating a layer formed of a transparent conductive layer such as indium tin oxide (ITO), indium zinc oxide (IZO), or indium gallium zinc oxide (IGZO) and a layer formed of a metal material such as gold (Au), silver (Ag), aluminum (Al), molybdenum (Mo), magnesium (Mg), palladium (Pd), copper (CU), or an alloy thereof, but is not limited thereto.

The passivation layer 208 may be disposed on the cathode 233.

In the meantime, even though not illustrated in the drawing, a capping layer may be disposed on the organic light emitting diode 230. The capping layer may be formed of a material having a high refractive index and optical absorbance to reduce scattered reflection.

The passivation layer 208 may be an inorganic layer and in this case, may be formed of silicon oxide (SiOx), silicon nitride (SiNx), or a plurality of layers thereof.

An adhesive film 209 and an encapsulation substrate 211 may be disposed on the passivation layer 208. The adhesive film 209 may be disposed to enclose the passivation layer 208.

The adhesive film 209 may protect the organic light emitting diode 230 of the pixel unit from moisture, oxygen, and impacts of the outside together with the passivation layer 208 and the encapsulation substrate 211.

The display device 100 according to the exemplary embodiment of the present disclosure configured as described above attaches only an edge of the cover glass 117 to the display panel 110 using the pad 140, instead of the optically clear resin (OCR) of the related art, to save the cost. That is, in the related art, the display panel and the entire surface of the cover glass are attached by surface-to-surface using the OCR. However, as the size of the display device is increased, an amount of used OCR is increased to increase a cost. Accordingly, according to the present disclosure, the OCR of the related art is removed and only an edge of the cover glass 117 is attached to the display panel 110 using the pad 140. As a result, for example, in the case of 86-inch model, the OCR of the related art is removed to save a cost of 88.8 dollars.

In the meantime, in an extra-large model, the pad 140 is divided into a plurality of portions to attach. Even though in FIG. 1, an example that the pad 140 is divided into six portions is illustrated, but the present disclosure is not limited thereto. In this case, the interval between the divided pads 140 (see FIG. 2) (hereinafter, referred to as a divided portion) is not sealed to cause a reliability issue due to the inflow of the air. That is, when the pad 140 is divided into a plurality of portions to attach, it is not easy to attach the pad 140 without any gap and the divided portions are not sealed to cause the inflow of the air.

Therefore, according to the present disclosure, the divided portion of the pad 140 is enclosed with a dam pad 150 formed of a soft material and the resin 160 is filled through a plurality of slits S formed in the dam pad 150 to seal the divided portion of the pad 140 from the outside. As described above, the divided portion of the pad 140 is sealed from the outside to implement effects of vacuum, waterproofing, and dustproofing.

The dam pad 150 may be provided at four corners and centers of upper and lower ends of the display panel 110 in which the divided portion of the pad 140 is located, but the present disclosure is not limited thereto. That is, the dam pad 150 may be provided at an upper left end, an upper right end, a center of the upper end, and a lower left end, a lower right end, and a center of the lower end of the display panel 110, respectively.

For example, a needle 185 of an injector 180 is inserted into the slit S to inject the resin 160. That is, the needle 185 of the injector 180 is inserted into the slit S of the dam pad 150 and the resin 160 is injected and then the needle 185 is pulled out.

At this time, the dam pad 150 may suppress the resin 160 from spreading widely due to the overflow of the resin 160. As a result, the interference with the other components is suppressed and an appearance defect may be improved.

Further, due to the structure of the dam pad 150, it is determined whether an amount of applied resin 160 is sufficient so that it is possible to confirm whether a task of applying the resin has been successful from the exterior.

At this time, the slit S functions to display a position where an operator applies the resin 160 and may seal the divided portion of the pad 140. As described above, the slit S is provided in the dam pad 150 to allow the operator to apply the resin 160, thereby saving a cost for a robot or a system.

In FIG. 2, even though it is illustrated that four slits S are provided, the present disclosure is not limited to the number of slits S.

Further, the slit S may function to suppress the resin which remains on the needle 185 after applying the resin 160 from being smeared on the cover glass 117. As a result, the interference with the other components is suppressed and an appearance defect may be improved.

The display device of the present disclosure configured as described above will be described again with reference to FIGS. 5, 6A, and 6B.

Figure 5:
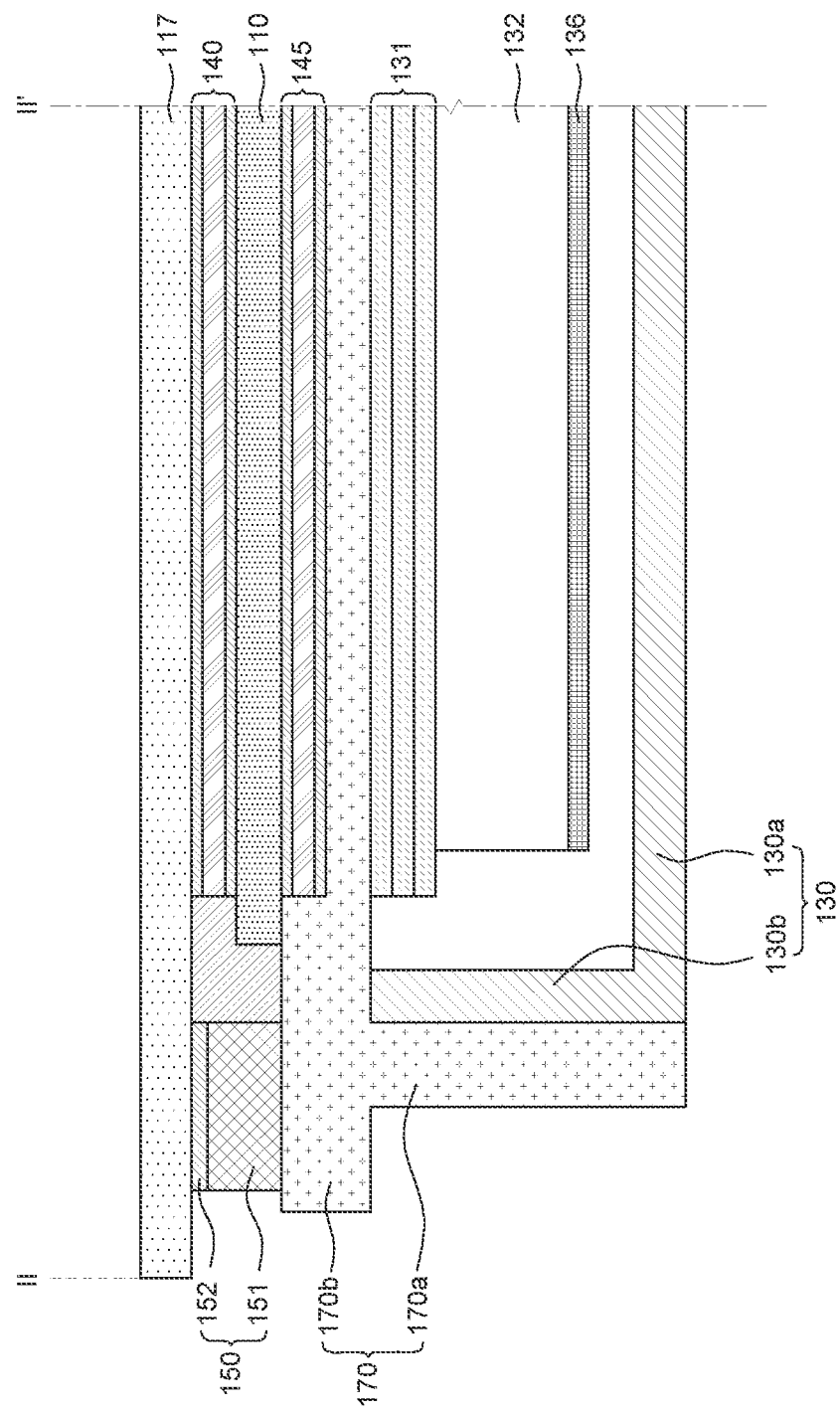
FIG. 5 is a cross-sectional view of a display device taken along the line II-II' of FIG. 2 according to an exemplary embodiment of the present disclosure.

FIG. 5 is a cross-sectional view of a display device taken along the line II-II' of FIG. 2 according to one embodiment.

Figure 6A:
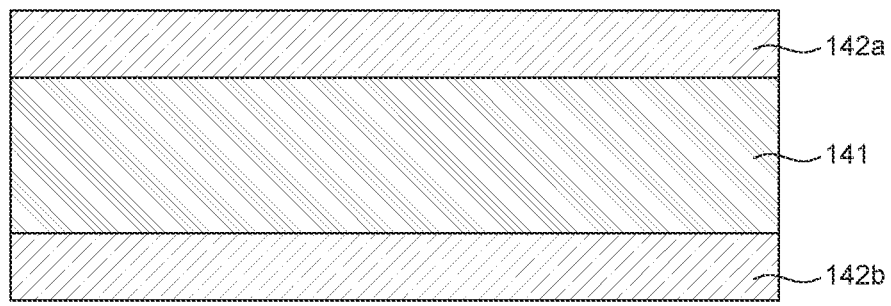
FIG. 6A is a cross-sectional view illustrating a structure of a pad according to an exemplary embodiment of the present disclosure.

FIG. 6A is a cross-sectional view illustrating a structure of a pad according to one embodiment.

Figure 6B:
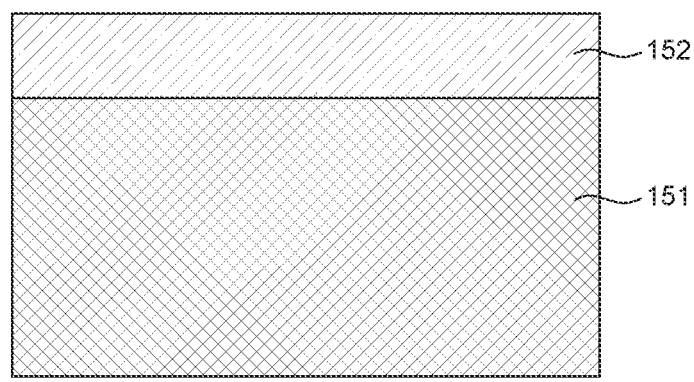
FIG. 6B is a cross-sectional view illustrating a structure of a dam pad according to an exemplary embodiment of the present disclosure.

FIG. 6B is a cross-sectional view illustrating a structure of a dam pad according to one embodiment.

FIG. 5 illustrates a cross-section of a display device in a state in which a backlight unit, a guide panel 170, and a lower cover 130 are fastened on the display panel 110 of FIG. 3 as an example.

Hereinafter, it is assumed that the display panel 110 is a liquid crystal display panel, but is not limited thereto.

A display device having a narrow bezel is actively being developed and a top case is omitted to reduce components of the display device to provide a light and thin display device.

FIG. 5 illustrates a display device in which a top case is omitted, according to an exemplary embodiment of the present disclosure.

Referring to FIG. 5, the display device according to the exemplary embodiment of the present disclosure may include a display panel 110, a backlight unit, a guide panel 170, and a lower cover 130.

The backlight unit supplies light to the display panel 110 and may be disposed below the display panel 110.

The backlight unit may include a light source (not illustrated) which is disposed along a length direction of at least one edge of the guide panel 170, a reflective plate 136 disposed above the lower cover 130, a light guide plate 132 disposed above the reflective plate 136, and a plurality of optical sheets 131 disposed above the light guide plate 132.

For example, the light source is configured by a light emitting diode assembly and may be configured by a light emitting diode and a printed circuit board in which the light emitting diode is mounted. The light emitting diode emits light having red, green, and blue to a front side directed to a light incident surface of the light guide plate 132 and a plurality of RGB light emitting diodes simultaneously emits light to implement white light by color mixture. However, it is not limited thereto so that each light emitting diode may implement white light and any case which implements white light is applicable.

The light guide plate 132 allows light incident from the light emitting diode to travel in the light guide plate 132 by several times of total reflection to spread in a wide region of the light guide plate 132 to provide a surface light source to the display panel 110. Such a light guide plate 132 may include a pattern with a specific shape on a rear surface to supply uniform surface light sources. For example, the pattern of the light guide plate 132 may include an elliptical pattern, a polygon pattern, or a hologram pattern to guide light incident into the light guide plate 132. Such a pattern may be formed on a rear surface of the light guide plate 132 by a printing method or an injecting method.

The reflective plate 136 is located on a rear surface of the light guide plate 132 to reflect light which passes through the rear surface of the light guide plate 132 toward the display panel 110, to improve the luminance of the light. A plurality of optical sheets 131 above the light guide plate 132 includes at least one diffusion sheet and at least one light collection sheet and diffuse or collect light passing through the light guide plate 132 to allow a more uniform surface light source to be incident to the display panel 110.

The display panel 110 and the backlight unit may be modulated by means of the guide panel 170, the lower cover 130, and the plurality of adhesive members.

The lower cover 130 in which the backlight unit is seated may include a bottom surface 130a which is a basis for assembling the entire mechanism configuring the display device and a vertical portion 130b formed by vertically bending the edge of the bottom surface 130a, but is not limited thereto.

For example, the guide panel 170 may include a side wall portion 170a which has a rectangular frame shape and encloses side surfaces of the light guide plate 132 and side surfaces of the printed circuit board and the vertical portions 130b. In addition, the guide panel 170 may include a support unit 170b which is inwardly bent from the side wall portion 170a to be disposed at an upper edge of the light guide plate 132. The edge of the display panel 110 may be supported by the support unit 170b. However, the present disclosure is not limited thereto.

The guide panel 170 may be referred to as a support main, a main frame, a main support, or a mold frame and the lower cover 130 may be referred to as a bottom frame, a bottom cover, or a cover bottom. However, the present disclosure is not limited thereto.

The guide panel 170 and the lower cover 130 may be manufactured with a material, such as polycarbonate (PC), aluminum, stainless steel, or electrolytic alloy galvanized steel (EGI), but may be manufactured with the other material.

The display panel 110 includes an active area used to substantially display images and a non-active area which encloses the active area. The non-active area which is referred to as a bezel area may be defined as an area in which light of the backlight unit is not supplied to the display panel 110 by the support unit 170b of the guide panel 170. In addition, the display panel 110 is fixed to the support unit 170b of the guide panel 170 to support the edge and to this end, a plurality of second adhesive members 145 may be interposed between the display panel 110 and the support unit 170b of the guide panel 170. However, the present disclosure is not limited thereto, so that the second adhesive member 145 may be omitted.

In the meantime, a plurality of first adhesive members, that is, pads 140 may be provided on a top surface of the edge of the display panel 110 so that the cover glass 117 is attached thereto. The pad 140 may be disposed on a top surface of the edge of the display panel 110 to fasten the cover glass 117 and the display panel 110 to each other.

As described above, according to the present disclosure, only an edge of the cover glass 117 is attached to the display panel 110 using the pad 140, instead of the OCR of the related art.

Referring to FIGS. 5 and 6A, the pad 140 may be configured by a double sided tape, for example, may be configured by a base layer 141 and adhesive layers 142a and 142b provided on both sides of the base layer 141, but the present disclosure is not limited thereto. For example, the base layer 141 may use plastic such as polyethylene terephthalate (PET), but is not limited thereto. The adhesive layers 142a and 142b may include a first adhesive layer 142a to be attached with the cover glass 117 and a second adhesive layer 142b to be attached with the display panel 110. That is, the first adhesive layer 142a is provided on a top surface of the base layer 141 and the second adhesive layer 142b is provided on a bottom surface of the base layer 141 to attach the cover glass 117 and the display panel 110.

The second adhesive member 145 may be configured by a base layer and adhesive layers provided on both sides of the base layer, similar to the above-described pad 140, but the present disclosure is not limited thereto.

The pad 140 which is a first adhesive member and the second adhesive member 145 are disposed to be spaced apart inwardly from an end of the display panel 110, but are not limited thereto.

The cover glass 117 further outwardly extends (or expands) from the display panel 110 and a dam pad 150 for sealing the divided portion of the pad 140 may be attached onto a rear surface of the extending edge of the cover glass 117. A rear surface of the dam pad 150 may be in contact with a top surface of the support unit 170b of the guide panel 170.

That is, in an extra-large model, the pad 140 is divided into a plurality of portions to attach. In this case, the divided portion of the pad 140 is not sealed to cause the reliability issue due to the inflow of air.

Therefore, according to the present disclosure, the divided portion of the pad 140 is enclosed with a dam pad 150 formed of a soft material and the resin 160 is filled through a plurality of slits S formed in the dam pad 150 to seal the divided portion of the pad 140 from the outside. As described above, the divided portion of the pad 140 is sealed from the outside to implement effects of vacuum, waterproofing, and dustproofing.

For example, the dam pad 150 may be provided at four corners and centers of upper and lower ends of the display panel 110 in which the divided portion of the pad 140 is located, but the present disclosure is not limited thereto. That is, the dam pad 150 may be provided at an upper left end, an upper right end, a center of the upper end, and a lower left end, a lower right end, and a center of the lower end of the display panel 110, respectively.

Referring to FIGS. 5 and 6B, the dam pad 150 may be configured by a single sided tape, for example, may be configured by a base layer 151 and an adhesive layer 152 provided on one side of the base layer 151, but the present disclosure is not limited thereto. The base layer 151 may use a material which is softer than the base layer 141 of the pad 140, for example, a urethane foam, but is not limited thereto.

The adhesive layer 152 is provided on a top surface of the base layer 151 to bond the cover glass 117 and the dam pad 150.

The dam pad 150 has a form of an open outline (open curved line) which has an internal space and encloses the divided portion of the pad 140 and the slit and the internal space may be filled with the resin 160.

After attaching the cover glass 117 to the display panel 110, the dam pad 150 may be attached onto a rear surface of the extending edge of the cover glass 117 so as to enclose the divided portion of the pad 140. Thereafter, the needle of the injector is inserted into the slit to inject the resin 160 into the internal space of the dam pad 150.

Both ends of the open outline (open curved line) of the dam pad 150 are in contact with an outside of the display panel 110 and the resin is injected in the internal space between the outside of the display panel 110 and the dam pad 150.

The dam pad 150 may have a thickness larger than that of the pad 140, and for example, the dam pad 150 may have a thickness corresponding to thicknesses of the pad 140 and the display panel 110. In this case, the resin 160 may be injected to fully enclose the outside of the display panel 110 including the divided portion of the pad 140. In the meantime, a part of the injected resin 160 may be filled into the gap between the dam pad 150 and the pad 140 and the divided portion of the pad 140.

The exemplary embodiments of the present disclosure can also be described as follows:

According to an aspect of the present disclosure, there is provided a display device. The display device includes a display panel, a cover glass on a top surface of the display panel, a pad interposed between the cover glass and the display panel and the pad is divided into a plurality of portions and a dam pad which encloses a divided portion of the divided pad and is disposed on a rear surface of an edge of the cover glass.

The display device may further include a backlight unit on a rear surface of the display panel and a guide panel including a side wall portion that encloses a side surface of the backlight unit and a support unit that is bent inwardly from the side wall portion to support the display panel.

The cover glass may outwardly extend from the display panel and the dam pad may be attached onto a rear surface of the extending edge of the cover glass.

The pad may be on a top surface of an edge of the display panel to fasten the cover glass and the display panel with each other.

The pad may comprise a double-sided tape.

The pad may include a base layer and an adhesive layer provided on a top surface and a bottom surface of the base layer.

The pad may be spaced apart inwardly from an end of the display panel with a predetermined distance.

The dam pad may be provided at four corners and centers of an upper end and a lower end of the display panel in which the divided portion of the pad is located.

The dam pad may comprise a single sided tape.

The dam pad may include a base layer and an adhesive layer on one surface of the base layer.

The base layer of the dam pad may comprise a material which is softer than the base layer of the pad.

The dam pad may comprise an internal space and a plurality of slits into which a resin is configured to be injected and may have an open outline (open curved line) form that encloses the divided portion of the pad.

The plurality of slits and the internal space of the dam pad may be filled with the resin.

Both ends of the open outline (open curved line) of the dam pad may be in contact with an outside of the display panel and the resin may be configured to be injected into the internal space between the outside of the display panel and the dam pad.

The dam pad may have a thickness which is greater than a thickness of the pad.

The dam pad may have a thickness corresponding to thicknesses of the pad and the display panel.

The resin may cover an outside of the display panel including the divided portion of the pad.

A part of the injected resin may be filled into a gap between the dam pad and the pad and the divided portion of the pad.

A rear surface of the dam pad may be in contact with a top surface of the support unit of the guide panel.

According to another aspect of the present disclosure, there is provided a display device. The display device includes a display panel; a cover glass on a top surface of the display panel; and a pad that is interposed between the cover glass and the display panel and the pad is divided into a plurality of portions, wherein the pad is disposed on a top surface of an edge of the display panel to fasten the cover glass and the display panel with each other, and wherein a divided portion of the divided pad is sealed by a resin.

The display device may further include a dam pad which encloses the divided portion of the pad and is disposed on a rear surface of an edge of the cover glass.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a display panel;
   a cover glass disposed over the display panel;
   a plurality of pads interposed between the cover glass and the display panel; and
   a dam pad that encloses the plurality of pads and is disposed on a rear edge of the cover glass.

2. The display device according to claim 1, further comprising:
   a backlight unit disposed under the display panel; and
   a guide panel including a side wall portion that encloses the backlight unit and a support unit that is bent inwardly from the side wall portion to support the display panel between the display panel and the backlight unit.

3. The display device according to claim 1, wherein the cover glass protrudes further outward than the display panel and the dam pad is attached to a rear edge of the protruded cover glass.

4. The display device according to claim 1, wherein a pad from the plurality of pads is disposed on an upper edge of the display panel to fasten the cover glass and the display panel with each other.

5. The display device according to claim 1, wherein a pad from the plurality of pads comprises a double-sided tape.

6. The display device according to claim 5, wherein the pad includes a base layer and an adhesive layer provided on both surfaces of the base layer.

7. The display device according to claim 1, wherein a pad from the plurality of pads is spaced apart inwardly from an end of the display panel with a predetermined distance.

8. The display device according to claim 1, wherein the dam pad is provided at each of four corners of the display panel and at centers of top and bottom of the display panel where each of the plurality of pads is positioned.

9. The display device according to claim 6, wherein the dam pad comprises a single sided tape.

10. The display device according to claim 9, wherein the dam pad includes a base layer and an adhesive layer on one surface of the base layer.

11. The display device according to claim 10, wherein the base layer of the dam pad comprises a material that is softer than the base layer of the pad.

12. The display device according to claim 1, wherein the dam pad comprises an internal space and a plurality of slits into which a resin is configured to be injected and has an open outline form that encloses the plurality of pads.

13. The display device according to claim 12, wherein the plurality of slits and the internal space of the dam pad are filled with the resin.

14. The display device according to claim 12, wherein both ends of the open outline of the dam pad are in contact with an outside of the display panel and the resin is configured to be injected into the internal space between the outside of the display panel and the dam pad.

15. The display device according to claim 1, wherein the dam pad has a thickness which is greater than a thickness of a pad from the plurality of pads.

16. The display device according to claim 15, wherein the dam pad has a thickness corresponding to thicknesses of the pad and the display panel.

17. The display device according to claim 14, wherein the resin covers the outside of the display panel including the plurality of pads.

18. The display device according to claim 17, wherein a part of the injected resin is filled into a gap between the dam pad and the pad and the plurality of pads.

19. The display device according to claim 2, wherein the dam pad is in contact with the support unit of the guide panel.

20. A display device, comprising:
    a display panel;
    a cover glass disposed over of the display panel; and
    a plurality of pads that are interposed between the cover glass and the display panel,
    wherein a pad from the plurality of pads is disposed on an upper edge of the display panel to fasten the cover glass and the display panel with each other, and
    wherein the plurality of pads are sealed by a resin.

21. The display device according to claim 20, further comprising a dam pad which encloses the plurality of pads and is disposed on a rear edge of the cover glass.

* * * * *